United States Patent
Lee et al.

(10) Patent No.: US 9,673,053 B2
(45) Date of Patent: Jun. 6, 2017

(54) METHOD FOR FABRICATING SEMICONDUCTOR DEVICE

(71) Applicant: UNITED MICROELECTRONICS CORP., Hsin-Chu (TW)

(72) Inventors: Rung-Yuan Lee, New Taipei (TW); Yu-Ting Li, Chiayi (TW); Jing-Yin Jhang, Tainan (TW); Chen-Yi Weng, New Taipei (TW); Jia-Feng Fang, Changhua County (TW); Yi-Wei Chen, Taichung (TW); Wei-Jen Wu, Tainan (TW); Po-Cheng Huang, Kaohsiung (TW); Fu-Shou Tsai, Keelung (TW); Kun-Ju Li, Tainan (TW); Wen-Chin Lin, Tainan (TW); Chih-Chien Liu, Taipei (TW); Chih-Hsun Lin, Ping-Tung County (TW); Chun-Yuan Wu, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 10 days.

(21) Appl. No.: 14/549,529

(22) Filed: Nov. 20, 2014

(65) Prior Publication Data
US 2016/0148816 A1    May 26, 2016

(51) Int. Cl.
*H01L 21/306* (2006.01)
*H01L 21/28* (2006.01)

(52) U.S. Cl.
CPC .. *H01L 21/30625* (2013.01); *H01L 21/28123* (2013.01)

(58) Field of Classification Search
CPC ............... H01L 21/30625; H01L 21/28123
See application file for complete search history.

(56) References Cited

U.S. PATENT DOCUMENTS

| | | | |
|---|---|---|---|
| 4,676,867 A | 6/1987 | Elkins et al. | |
| 5,516,729 A | 5/1996 | Dawson et al. | |
| 5,532,191 A | 7/1996 | Nakano et al. | |
| 5,560,802 A | 10/1996 | Chisholm | |
| 5,920,792 A | 7/1999 | Lin | |
| 6,242,348 B1 * | 6/2001 | Kamal | H01L 21/28052 257/E21.165 |
| 6,251,788 B1 | 6/2001 | Liou | |
| 6,265,315 B1 | 7/2001 | Lee et al. | |
| 7,651,922 B2 | 1/2010 | Matsuda | |
| 8,173,548 B2 | 5/2012 | Hung et al. | |
| 8,334,190 B2 * | 12/2012 | Davis | C09G 1/02 257/E21.23 |
| 8,367,534 B2 | 2/2013 | Chen et al. | |
| 8,409,456 B2 | 4/2013 | Lan et al. | |
| 8,524,587 B2 * | 9/2013 | Chen et al. | 438/584 |

(Continued)

OTHER PUBLICATIONS

Huang, Title of Invention: Semiconductor Process, U.S. Appl. No. 14/083,456, filed Nov. 19, 2013.

*Primary Examiner* — Long Pham
(74) *Attorney, Agent, or Firm* — Winston Hsu

(57) ABSTRACT

A method for fabricating semiconductor device is disclosed. The method includes the steps of: providing a substrate; forming a first material layer on the substrate; forming a stop layer on the first material layer; forming a second material layer on the stop layer; and performing a planarizing process to remove the second material layer, the stop layer, and part of the first material layer for forming a gate layer.

3 Claims, 2 Drawing Sheets

(56) References Cited

U.S. PATENT DOCUMENTS

2006/0183323 A1* 8/2006 Rhodes ........................ 438/655
2012/0196410 A1 8/2012 Tsai et al.
2013/0187236 A1 7/2013 Xie et al.

* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly, to a method of fabricating gate layer for metal-oxide semiconductor transistor.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Currently, poor gate height control causing poor gate height uniformity has been an important topic for device performance improvement as gate height loading may induce potential risk on removal of dummy gate during replacement metal gate (RMG) stage of FinFET process. Hence, how to improve the current FinFET fabrication to resolve the aforementioned issue has become an important task in this field.

SUMMARY OF THE INVENTION

According to a preferred embodiment of the present invention, a method for fabricating semiconductor device is disclosed. The method includes the steps of: providing a substrate; forming a first material layer on the substrate; forming a stop layer on the first material layer; forming a second material layer on the stop layer; and performing a planarizing process to remove the second material layer, the stop layer, and part of the first material layer for forming a gate layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
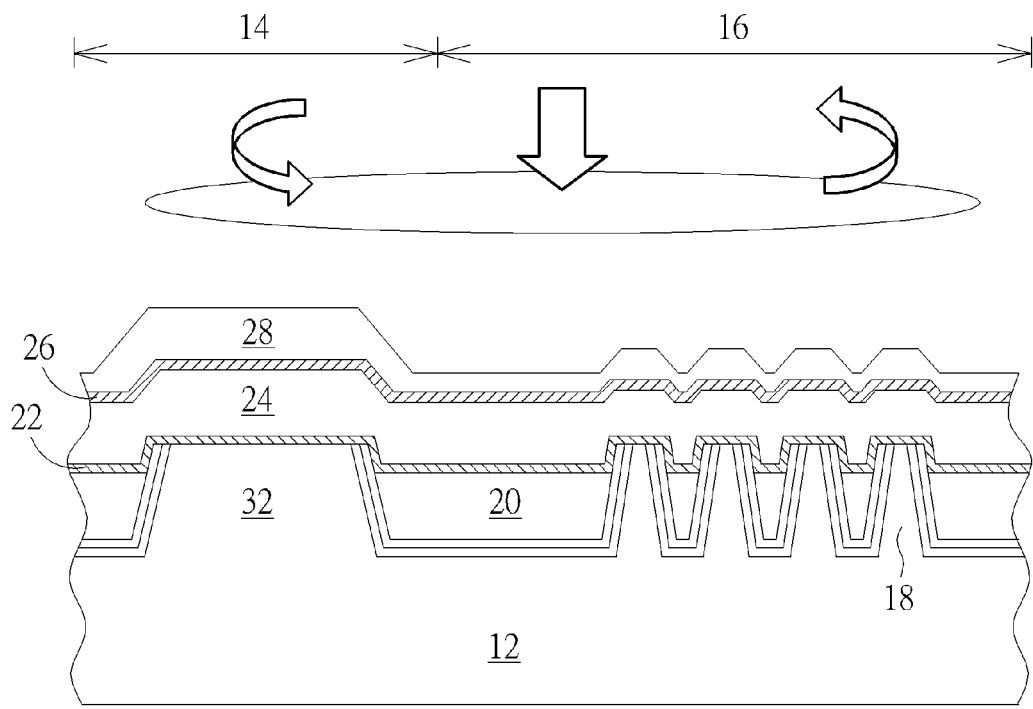
FIGS. 1-4 illustrate a method for fabricating semiconductor device according to a preferred embodiment of the present invention.

Referring to FIGS. 1-4, FIGS. 1-4 illustrate a method for fabricating semiconductor device according to a preferred embodiment of the present invention. As shown in FIG. 1, a substrate 12, such as a silicon substrate or silicon-on-insulator (SOI) substrate is first provided, and a first region 14 and a second region 16 are defined on the substrate 12. In this embodiment, the first region 14 is preferably an input/output (I/O) region while the second region 16 is a core region, but not limited thereto. A silicon island 32 is then formed on the first region 14 to form planar devices afterwards while a plurality of fin-shaped structures 18 is formed on the second region 16 of the substrate 12, in which the bottom of the fin-shapes structures 18 is preferably enclosed by an insulating layer, such as silicon oxide to form shallow trench isolation (STI) 20.

The formation of the fin-shaped structures 18 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the underneath substrate, and through additional fin cut processes, desirable pattern structures, such as stripe patterned fin-shaped structures could be obtained.

After the fins-shaped structures 18 are formed, a gate dielectric layer 22, a first material layer 24, a stop layer 26, and a second material layer 28 are sequentially formed on the fin-shaped structures 18, silicon island 32, and STI 20. In this embodiment, the gate dielectric layer 22 is preferably composed of silicon oxide, and the first material layer 24 and the second material layer 28 could be composed of same material or different material. If the first material layer 24 and second material layer 28 are composed of same material, both the first material layer 24 and second material layer 28 are preferably composed of amorphous silicon, whereas if the first material layer 24 and the second material layer 28 are composed of different material, the first material layer 24 is preferably composed of amorphous silicon while the second material layer 28 is composed of silicon oxide. Moreover, the thickness of the first material layer 24 is preferably between 1450 Angstroms to 1550 Angstroms, the stop layer 26 is between 45 Angstroms to 55 Angstroms, and the second material layer 28 is between 550 Angstroms to 650 Angstroms.

The formation of the stop layer 26 could be accomplished by conducting an oxidation process, a chemical vapor deposition (CVD) process, or by utilizing hydrogen gas ($H_2$) to perform a surface treatment on the first material layer 24, in which the stop layer 26 could be selected from the group consisting of silicon nitride, silicon oxide, silicon oxynitride, and silicon carbon nitride.

Figure 2:
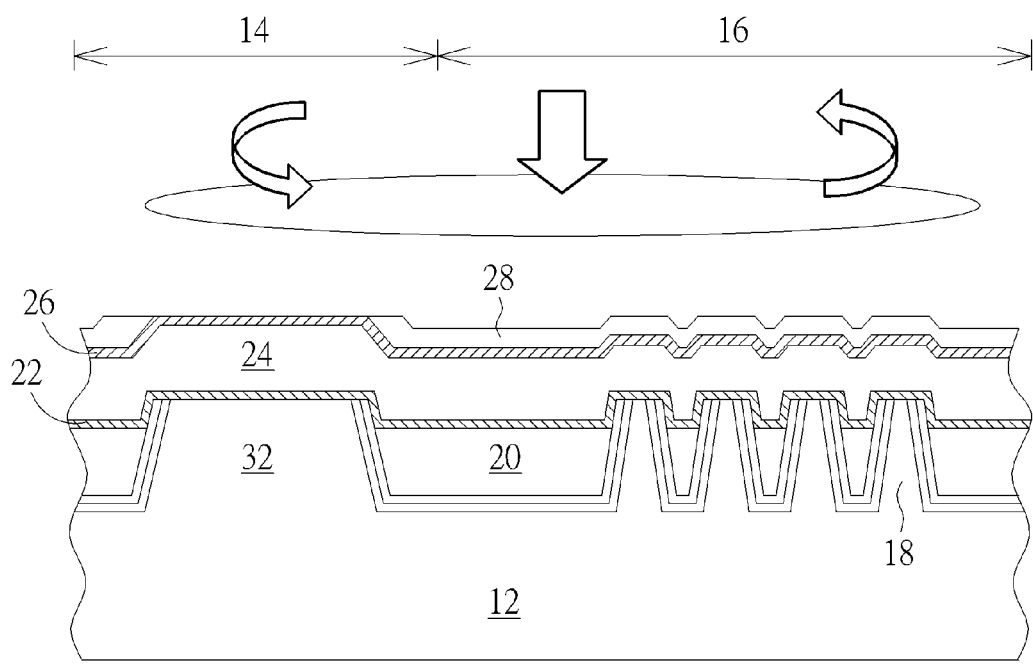
Figure 3:
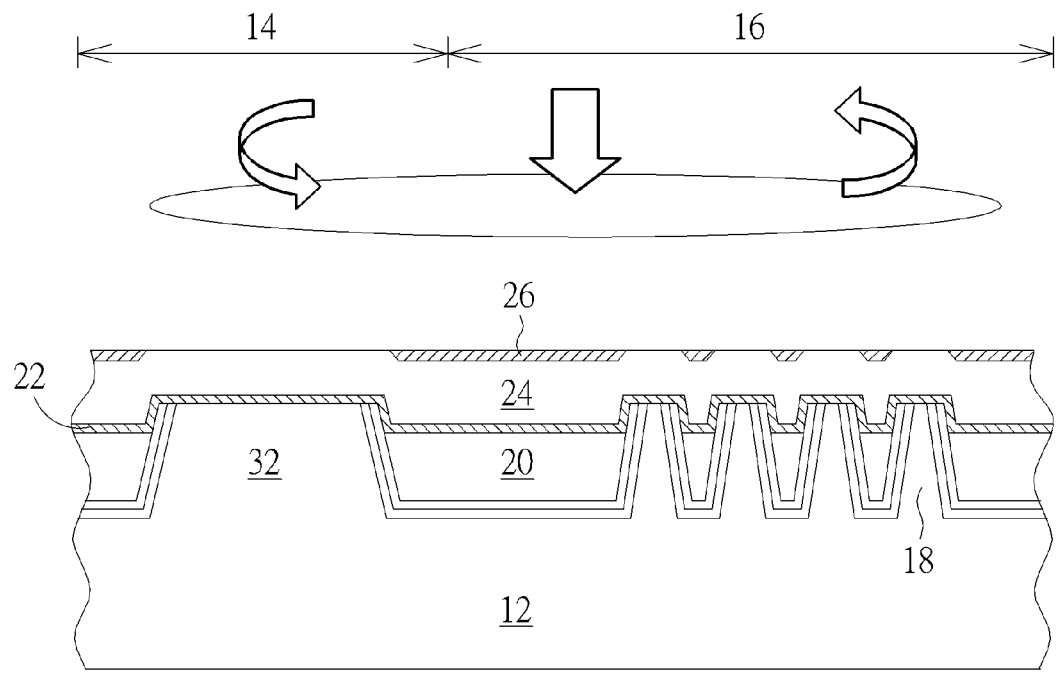
Figure 4:
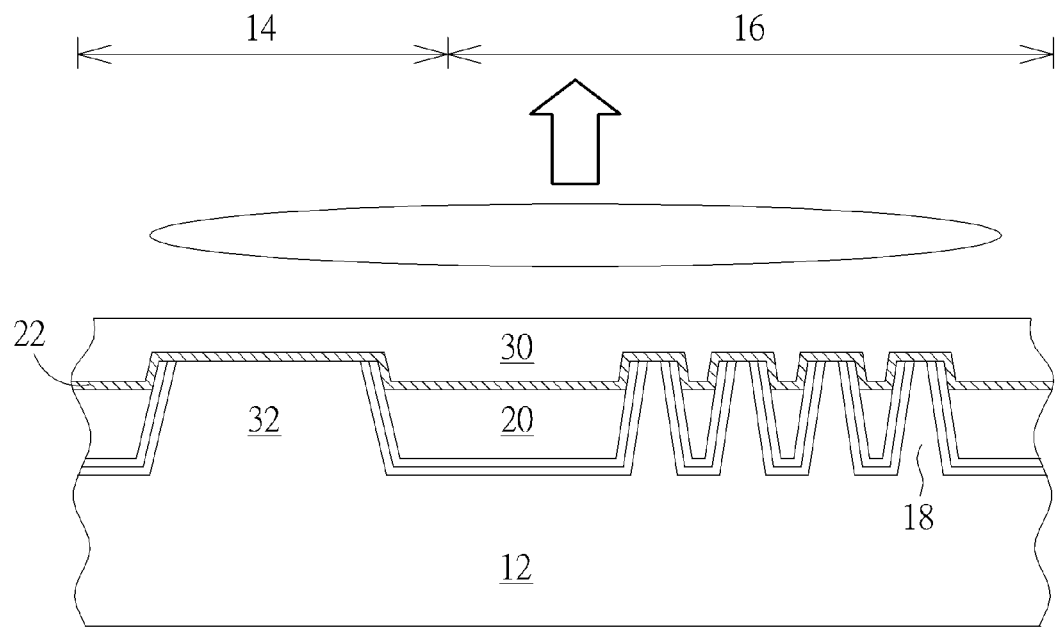

Next, as shown in FIGS. 2-4, a planarizing process, such as a chemical mechanical polishing (CMP) process is conducted to planarize the second material layer 28, stop layer 26, and part of the first material layer 24.

According to an embodiment of the present invention, when the first material layer 24 and second material layer 28 are composed of same material, such as when both the first material layer 24 and second material layer 28 are composed of amorphous silicon, the first material layer 24 and stop layer 26 preferably have different polishing selectivity, and the stop layer 26 and second material layer 28 also have different polishing selectivity, or more specifically, a polishing rate between the first material layer 24 and the stop layer 26 is 10:1 and a polishing rate between the second material layer 28 and stop layer 26 is 10:1.

Preferably, as shown in FIGS. 1-2, a first stage of planarizing process is conducted by using CMP to remove part of the second material layer 28 and stop on the stop layer 26. By using higher polishing rate on the amorphous silicon and lower polishing rate on the silicon nitride or using a polishing rate of 10:1 between the second material layer 28 composed of amorphous silicon and the stop layer 26 composed of silicon nitride, it would be easier to slow down or stop the polishing process on the stop layer 26 as shown in FIG. 2.

Next, as shown in FIGS. 2-3, a second stage of planarizing process is conducted by using CMP to smooth the top surface of stop layer 26.

Next, as shown in FIGS. 3-4, a third stage of planarizing process is conducted by using CMP to remove the remaining stop layer 26 entirely while producing a smooth first material layer 24 surface. Similar to the polishing conducted in FIGS. 1-2, a CMP is conducted by using lower polishing rate on the silicon nitride layer and higher polishing rate on the amorphous silicon or using a polishing rate of 10:1 between the first material layer 24 and the stop layer 26.

According to additional embodiments of the present invention, an additional dry etching back process could be conducted on the exposed surface of the first material layer 24 to further smooth or lower the depth of the layer 24. Moreover, multiple clean steps could be inserted between various stages of the aforementioned planarizing process. For instance, a clean step could be inserted between the surface treatment step for forming stop layer 26 and the deposition of second material layer 28, a clean step could be inserted between the deposition of second material layer 28 and the CMP process conducted on second material layer 28, and a clean step could be inserted between the CMP process conducted on the second material layer 28 and the dry etching back process conducted on the first material layer 24, which are all within the scope of the present invention.

This forms a gate layer 30 on the substrate 12, in which the gate layer 30 preferably has a thickness of approximately 1000 Angstroms. The gate layer 30 could then be patterned into a gate structure and standard FinFET process could be conducted thereafter to form elements such as spacer and source/drain regions adjacent to the gate structure. As the formation of these elements is well known to those skilled in the art, the details of which are not explained herein for the sake of brevity.

Alternatively, instead of using same material for both the first material layer 24 and second material layer 28, it would also be desirable to use different material for the first material layer 24 and second material layer 28 during the CMP process. According to another embodiment of the present invention, when the first material layer 24 and second material layer 28 are composed of different material, such as when the first material layer 24 is composed of amorphous silicon and second material layer 28 is composed of silicon oxide, a first stage of planarizing process, or a high selectivity CMP process is first conducted to remove part of the second material layer 28 composed of silicon oxide and stop on the stop layer 26, as shown in FIGS. 1-2. Next, as shown in FIGS. 2-3, a second stage of planarizing process, or a non-selective or anisotropic etching process is conducted with an etching selectivity of 1:1 between silicon oxide and silicon nitride to remove the remaining second material layer 28 composed of silicon oxide entirely while some of the stop layer 26 composed of silicon nitride still remains. Next, as shown in FIGS. 3-4, a third stage of planarizing process, or another non-selective or anisotropic etching process is carried out with an etching selectivity of 1:1 between silicon nitride and amorphous silicon to remove the stop layer 26 completely and stop on a desired depth of first material layer 24. This again forms a gate layer 30 for fabricating gate structure afterwards.

Overall, the present invention discloses an approach of forming two material layers sandwiching a stop layer therebetween on a substrate and then conducting a CMP process to remove the top material layer and the stop layer for forming a gate layer. Depending on the demand of the process, the two material layers could be composed of same material or different material while in either case, the two material layers and the stop layer preferably have different polishing selectivity. By using different polishing selectivity between the two material layers and the stop layer, the present invention could effectively control the height of the gate layer and improve the uniformity of the gate layer substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate;
    forming a first material layer on the substrate;
    forming a stop layer on the first material layer;
    forming a second material layer on the stop layer;
    performing a chemical mechanical polishing (CMP) process to remove part of the second material layer;
    performing a first etching process to remove the remaining second material layer; and
    performing a second etching process to remove the stop layer for forming a gate layer.

2. The method of claim 1, wherein the first etching process comprises an anisotropic etching process.

3. The method of claim 1, wherein the second etching process comprises an anisotropic etching process.

* * * * *